United States Patent
Cai

(10) Patent No.: US 8,543,882 B2
(45) Date of Patent: Sep. 24, 2013

(54) JOINT CARRIER PHASE ESTIMATION AND FORWARD ERROR CORRECTION

(75) Inventor: Yi Cai, Jackson, NJ (US)

(73) Assignee: Tyco Electronics Subsea Communications LLC, Eatontown, NJ (US)

( * ) Notice: Subject to any disclaimer, the term of this patent is extended or adjusted under 35 U.S.C. 154(b) by 346 days.

(21) Appl. No.: 12/905,652

(22) Filed: Oct. 15, 2010

(65) Prior Publication Data

US 2012/0096327 A1 Apr. 19, 2012

(51) Int. Cl.
*H03M 13/05* (2006.01)

(52) U.S. Cl.
USPC ............................................. 714/752

(58) Field of Classification Search
USPC ............................................. 714/752
See application file for complete search history.

(56) References Cited

U.S. PATENT DOCUMENTS

| | | | |
|---|---|---|---|
| 6,560,303 B1 | 5/2003 | Fan et al. | |
| 7,397,869 B2 * | 7/2008 | Ginesi et al. | 375/326 |
| 7,409,024 B2 * | 8/2008 | Ginesi et al. | 375/362 |
| 7,412,209 B2 * | 8/2008 | Santoru et al. | 455/63.1 |
| 7,720,136 B2 * | 5/2010 | Friedman et al. | 375/220 |
| 8,306,418 B2 * | 11/2012 | Cai | 398/29 |
| 8,364,179 B2 * | 1/2013 | Ashkenazi et al. | 455/464 |
| 8,385,839 B2 * | 2/2013 | Ashkenazi et al. | 455/69 |
| 2005/0111603 A1 * | 5/2005 | Ginesi et al. | 375/362 |
| 2010/0172427 A1 | 7/2010 | Kleider et al. | |
| 2010/0232796 A1 * | 9/2010 | Cai | 398/79 |
| 2012/0148265 A1 * | 6/2012 | Chang et al. | 398/208 |
| 2012/0290893 A1 * | 11/2012 | Hauske et al. | 714/758 |

OTHER PUBLICATIONS

Written Opinion of the International Searching Authority for corresponding application No. PCT/US2011/055110.

* cited by examiner

*Primary Examiner* — Amine Riad

(57) ABSTRACT

Methods and systems for processing an optical signal in a communication system are disclosed. The disclosed methods yield benefits for estimation and tracking of carrier phase of received signals at a digital coherent receiver without the use of differential coding. Specifically, phase ambiguity is removed by calculating the slope of the CPE at a location where the CPE begins to lose track of the received carrier phase signal. As such, a CPE offset adjustment may be applied in accordance with the calculated slope to reduce the number of ones and zeros corrected by a FEC decoder. Thus, the FEC aided CPE scheme may be a feed forward scheme that requires no training.

18 Claims, 6 Drawing Sheets

JOINT CARRIER PHASE ESTIMATION AND FORWARD ERROR CORRECTION

FIELD OF THE INVENTION

Embodiments of the present disclosure relate to the field of fiber optic communication systems. More particularly, the present disclosure relates to long haul fiber optic communication systems utilizing forward error correction (FEC) with joint carrier phase estimation (CPE).

DISCUSSION OF RELATED ART

In optical communication systems, an optical signal may be modulated with digital data in order to transmit the data over an optical transmission path. Different parameters of the optical signal may be varied to represent digital data (e.g., the binary digits "0" and "1"). According to one type of modulation, known as Quadrature phase-shift-keying (QPSK), the binary digits are indicated by differential phase transitions in the optical signal. For example, a phase change in optical signal may indicate "0" and no phase change in the optical signal may indicate "1".

One problem associated with optical communications systems is the integrity of the data being communicated, particularly when optical signals are transmitted over long distances in long-haul communication systems such as, for example, undersea fiber optic cable systems. Accumulated noise contributed by many different sources in a transmission path may cause difficulty in differentiating between the binary digits (i.e., the ones and zeros) in a data stream.

However, applying coherent phase-shift-keying (PSK) modulation can further improve optical fiber transmissions by improving receiver sensitivity. Implementations of coherent detection employing high-speed digital signal processing (DSP), where the carrier phase and polarization drifting of the optical signal are estimated and tracked by DSP without adaptively adjusting the local oscillator (LO), have been proposed. The CPE can be performed with two classes of schemes, i.e. feedforward and decision-feedback (DF) schemes.

One type of feedforward scheme used may be the Mth power scheme which removes an M-ary phase-shift-keying (PSK) modulation by raising the received signal field to its Mth power. The performance of the Mth power scheme, however, is limited by the required differential coding. Alternatively, it may be advantageous in some systems to use the DF scheme for CPE, which removes data modulation based on preceding decisions.

When comparing the two types of CPE schemes, the Mth power scheme and the decision feedback scheme, the Mth power scheme is a feed forward scheme that does not require training but is limited because it induces an M-fold phase ambiguity in the CPE. The decision feedback scheme requires training and induces a feedback delay in the CPE. The decision feedback scheme may also induce error propagation which may cause CPE failure.

To solve the problems associated with M-fold phase ambiguity in the Mth power scheme and the potential problems caused by error propagation in the decision feedback scheme differential coding may be used. However, implementing differential coding induces a receiver sensitivity penalty.

Forward Error Correction (FEC) is one technique used to help compensate for signal degradation and provides "margin improvements" to the system. FEC typically involves the insertion of a suitable error correction code into a transmitted data stream to facilitate detection and correction of data errors about which there is no previously known information. Error correction codes are generated in an FEC encoder for the data stream which introduces some redundancy in the binary information sequence. The error correction codes are then sent to a receiver including a FEC decoder. The FEC decoder recovers the error correction codes and uses them to correct any errors in the received data stream.

An FEC aided CPE scheme can resolve the M-fold phase ambiguity and/or the error propagation problems by FEC decoding without the use of differential coding. Moreover, the FEC aided CPE scheme may be a feed forward scheme that requires no training.

DETAILED DESCRIPTION

Figure 1:
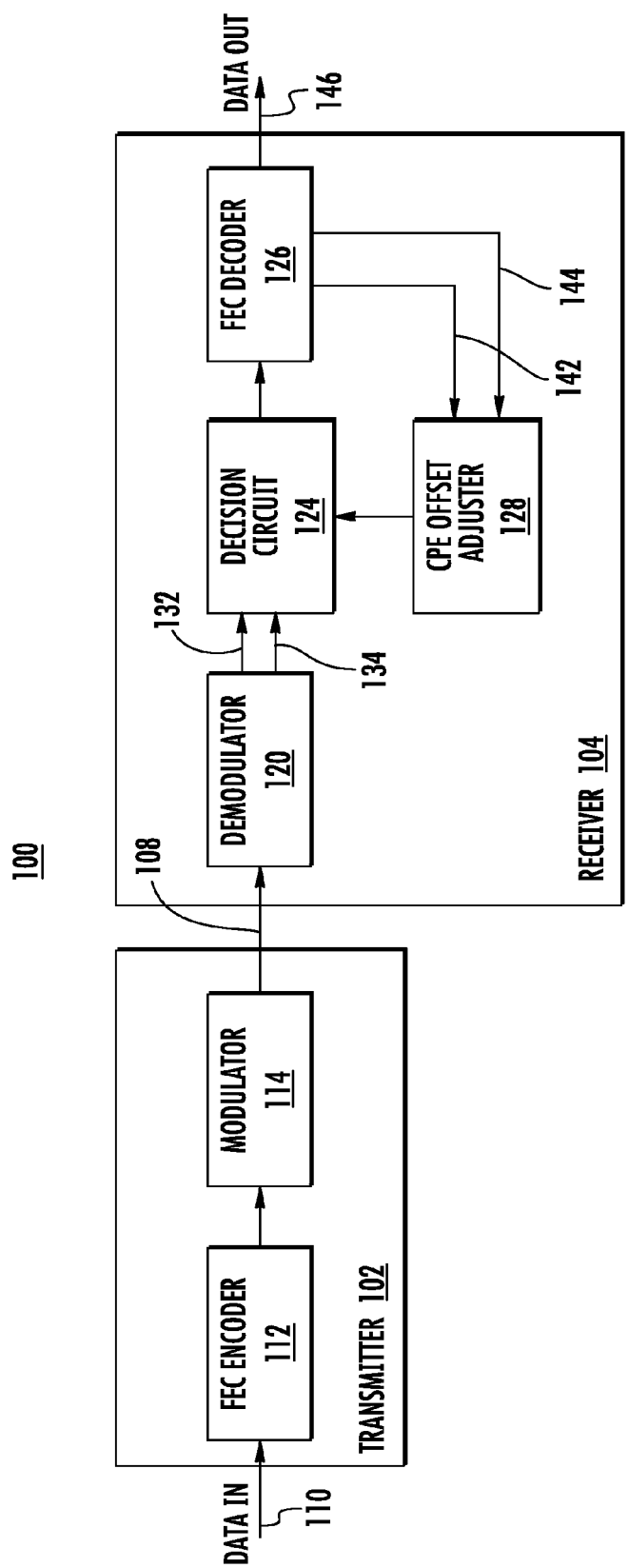
FIG. 1 is a schematic block diagram of an optical communication system including a FEC aided CPE scheme that is consistent with one embodiment of the present disclosure.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 shows an optical communication system 100 including an apparatus and method for a FEC aided CPE scheme consistent with one embodiment of the present invention. The system is capable of resolving M-fold phase ambiguity and/or error propagation problems by FEC decoding without the use of differential coding. Although exemplary embodiments are described in the context of an optical system, the broad concepts discussed herein may be implemented in other communication systems transmitting and receiving other types of signals.

The optical communications system 100 may include a transmitter 102 for transmitting an encoded optical signal 108 and a receiver 104 for receiving the encoded optical signal 108. Those of ordinary skill in the art will recognize that the depicted system is highly-simplified for ease of explanation. For example, the transmitter 102 and the receiver 104 may be configured as one or more transceivers capable of performing both transmitting and receiving functions. The illustrated embodiments herein are provided only by way of explanation, not limitation.

The transmitter 102 includes an FEC encoder 112 that encodes a data stream 110 with an error correction code and a modulator 114 that modulates an optical signal with the encoded data stream. The data stream 110 may be a binary data stream including a series of bits. Numerous FEC codes are known, each with different properties related to how the codes are generated and consequently how they perform. Examples of known error correcting codes include the linear and cyclic Hamming codes, the ecylic Bose-Chaudhuri-Hocquenghem (BHC) codes, the convolutional (Viterbi) codes, the cyclic Golay and Fire codes, and some newer codes such as the turbo convolutional and product codes (TCC, TPC) and the low density parity check (LDPC) code. Hardware and software configurations for implementing various error correcting codes in the encoder 112 and a corresponding decoder 126 are known to those ordinarily skilled in the art.

The modulator 114 may be implemented using optical modulation techniques and equipment known to those skilled in the art. The modulator 114 may modulate encoded data on an optical wavelength, e.g. from a continuous-wave laser source, using any modulation format known in the art, including, but not limited to, On-Off-Keying (OOK), Phase Shift Keying (PSK), and Differential Phase-Shift-Keying (DPSK) formats. These formats may be implemented in one or more known variations including, but not limited to, Return-to-Zero (RZ), Non-Return to Zero (NRZ) and Chirped-Return-to-Zero (CRZ) variations. For example, DPSK formats, such as RZ-DPSK, have proven advantageous in connection with long-haul optical communication systems.

The receiver 104 includes a demodulator 120, a decision circuit 124, a FEC decoder 126, and a CPE offset adjuster 128. The demodulator 120 demodulates the modulated FEC encoded optical signal 108 (e.g. using QPSK demodulation) and produces an in-phase signal 132 (I channel) and quadrature signal 134 (Q channel). The demodulator 120 may be a QPSK demodulator based on an optical delay interferometer, such as a Mach-Zehnder interferometer. An optical delay interferometer may be used to split the optical signal 108, create a delay in one of the split signals, and recombine the split signals to form the in-phase and quadrature signals 132, 134. Such demodulation techniques are generally known to those skilled in the art.

The decision circuit 124 receives the demodulated signals 132 and 134 as an input signal. The decision circuit 124 quantizes the signals 132 and 134 using a decision threshold, then re-times the quantized data streams to produce an output signal 146 via FEC decoder 126 which includes a stream of data bits, i.e. logic "1"s and "0"s. The decision circuit 124 may be implemented using techniques and detection circuitry known to those skilled in the art. In one embodiment, the decision circuit may include a comparator for comparing the signals 132 and 134 with a decision threshold and quantizing it to the stream of "1's" and "0's", followed by a re-timing circuit. In another embodiment, the decision circuit may include a D-Flip Flop (D-FF) with an input allowing for decision threshold adjustment and a clock recovery circuit. In yet another embodiment, the decision circuit may include a known Clock & Data Recovery circuit (CDR) with a decision threshold adjustment input.

The FEC decoder 126 receives the detected and re-timed signal from decision circuit 124 and decodes the signals consistent with the implemented FEC scheme. The FEC decoder 126 provides one or more feedback signals, e.g. on feedback paths 142 and 144, to the CPE offset adjuster 128. The feedback provided from the FEC decoder 126 to the CPE offset adjuster 128 includes information indicating the total number of "1"s and the total number of "0"s that were corrected by the FEC decoder 126 in a particular I channel or Q channel codeword (e.g., frame alignment word).

The total number of errors corrected by the FEC decoder 126 in a particular codeword (e.g., frame alignment word) may be determined by adding the total number of corrected "1"s to the total number of corrected "0"s, or may be derived separately from information in the feedback signals from the FEC decoder 126. In one embodiment, adjustment of the CPE offset may occur only if the total number of reported errors over one or more sampling periods exceeds a predetermined error threshold. This approach may prevent unnecessary adjustments of the CPE offset when the total number of errors is very low and the statistical validity of the information from the FEC is low. In another embodiment, adjustment may be performed continuously without regard to the total number of reported errors. The CPE offset adjuster 128 may be configured for adjusting the CPE offset in response to the feedback signals from the FEC decoder 126 to adjust the CPE offset of the receiver 104. For any particular sampling period or codeword, the CPE offset may be adjusted to find the correct offset value (e.g., 90° or −90°). As such, the adjustment may reduce the number of corrected errors detected in the FEC decoder 126.

The data to be transmitted via transmitter 102 may be modulated, for example, using a QPSK format. The polarity of the demodulated data, i.e. true or inverted, depends on the operating point of the QPSK demodulator. The direction the decision circuit 124 chooses to determine the logic of the data bits depends on the polarity of the data. However, an inherent problem associated with typical coherent QPSK systems is that of phase ambiguity at the receiver. This phase ambiguity is due to the general inability of the receiver to distinguish the reference phase from the other phase(s) of the received carrier. To account for an unknown demodulated data polarity, the CPE scheme may be adjusted by the CPE offset adjuster 128.

Figure 2A:
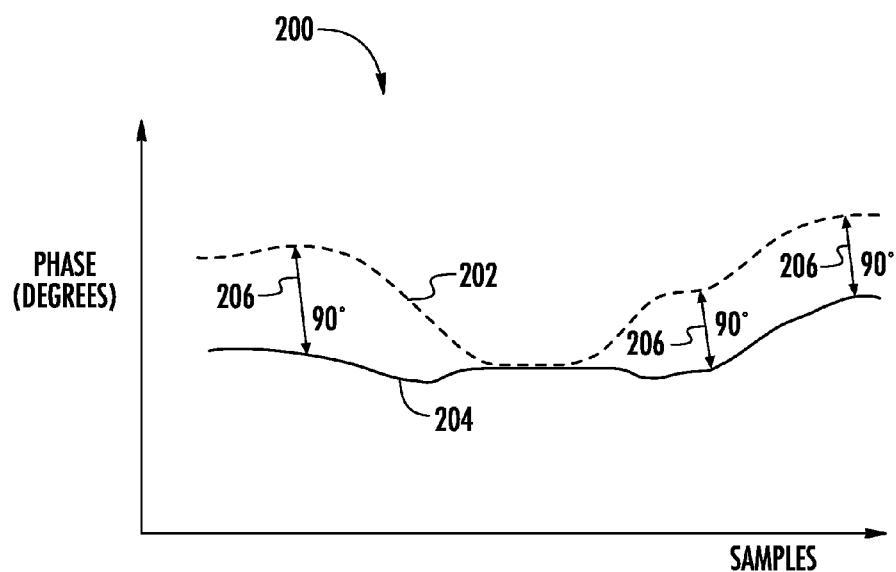
FIG. 2a is a depiction of correction of phase tracking in accordance with the present disclosure.
Figure 2B:
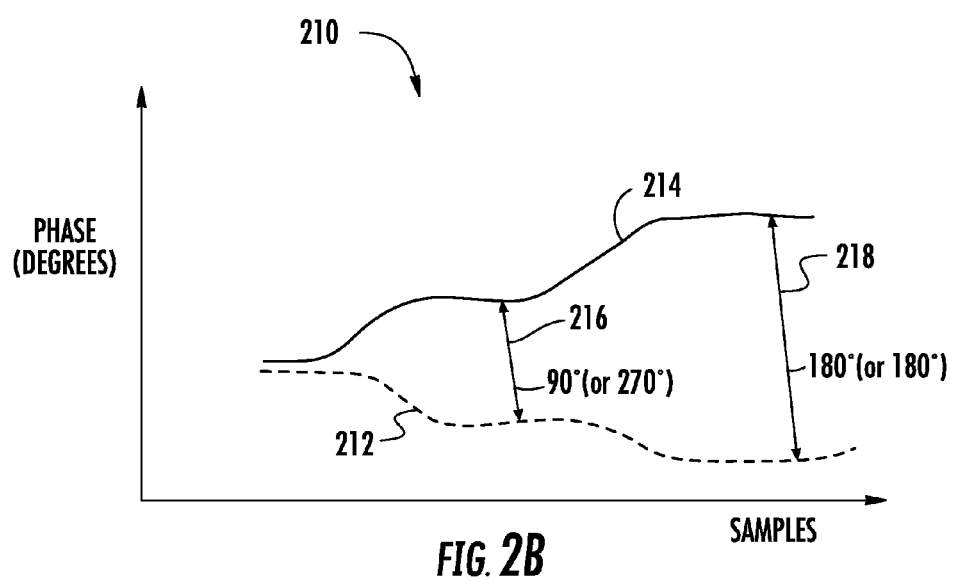
FIG. 2b is a depiction of correction of phase tracking in accordance with the present disclosure.

As illustrated in FIGS. 2a and 2b, a feature of CPE schemes is that when CPE ambiguity occurs, the estimated carrier phase substantially converges to a point $2i\pi/M$, where i may equal 1, 2, or (M/2)−1 away from an accurate CPE. Additionally, as is known in the art when implementing a modulation scheme or format each of the received symbols received by the receiver is demodulated to one of M points in the constellation. For example, when implementing a QPSK modulation scheme M is set to 4. Thus, when the CPE scheme used by the receiver loses track of the carrier phase, the CPE offset between a carrier phase estimate and the carrier phase may be one of the following $\pi/2$, $\pi$, or $3\pi/2$ radians (or 90°, 180°, or −90°).

FIG. 2a is a notional depiction (not drawn to scale) of a carrier phase diagram 200 associated with a receiver consistent with the present disclosure. Equipment for observing a carrier phase diagram associated with a data signal is well known and commercially available. It is well known, for example, that a carrier phase diagram associated with a data signal may be observed on an oscilloscope by monitoring the data signal phase on the vertical input of the oscilloscope and triggering on the data clock.

As shown in FIG. 2a, the carrier phase may be set to or operating at an initial value or operating point as indicated on the carrier phase diagram 200 by the dashed line 202. The carrier phase estimate 204, as illustrated by solid line 204, may lose track of the carrier phase 202. For example, the carrier phase estimate may be offset by 90°. Thus, to match the carrier phase 202, the CPE may be adjusted to a 90° phase estimation offset by the CPE offset adjuster 128.

FIG. 2b is a notional depiction (not drawn to scale) of a carrier phase diagram 210 associated with a receiver consistent with the invention. As shown in FIG. 2b, the carrier phase may be set to an initial value indicated on the carrier phase diagram 210 by the dashed line 212. In the illustrated exemplary embodiment, the total number of reported errors over one or more sampling periods exceeds a predetermined error threshold. As such, the carrier phase estimate 214 as illustrated by the solid line 214, may lose track of the carrier phase at the triggering frame alignment word or particular sampling period. The detected slope of the CPE 214 at the triggering point may be a steep positive slope. Thus, to match the carrier phase 212, the CPE 214 may be adjusted with a −90° (or 270°) phase offset 216. Likewise, the carrier phase estimate 214 may be offset by −180° (or 180°). Thus, to match the carrier phase 212 the CPE may be adjusted with a −180° phase estimate offset 218.

Table 1, below, illustrates an example of the type of phase estimation offset that may occur in a QPSK system. In Table 1, CPE offset and it's corresponding I and Q components is depicted. For example, the detected in-phase I and quadrature Q signal data 132, 134 may be inverted and/or swapped. In Table 1 the "I" and "Q" represent transmitted I and Q data, respectively, and "I" and "Q" represent inverted and transmitted I and Q data.

TABLE 1

| CPE OFFSET | DETECTED I CHANNEL | DETECTED Q CHANNEL |
| --- | --- | --- |
| −90° | Q | I |
| 90° | Q | I |
| 180° | I | Q |

In order to determine whether the CPE should be adjusted by 90° or −90°, the point at which the offset begins may first be identified. To determine where the offset starts the FEC decoder 126 monitors the total number of reported errors over one or more sampling periods. When the total number of reported errors over one or more sampling periods exceeds a predetermined error threshold, the codeword or frame alignment word associated with that sampling period is identified. This indicates where the phase tracking of the signal at receiver 104 was lost and where the CPE offset adjustment will start.

Figure 3:
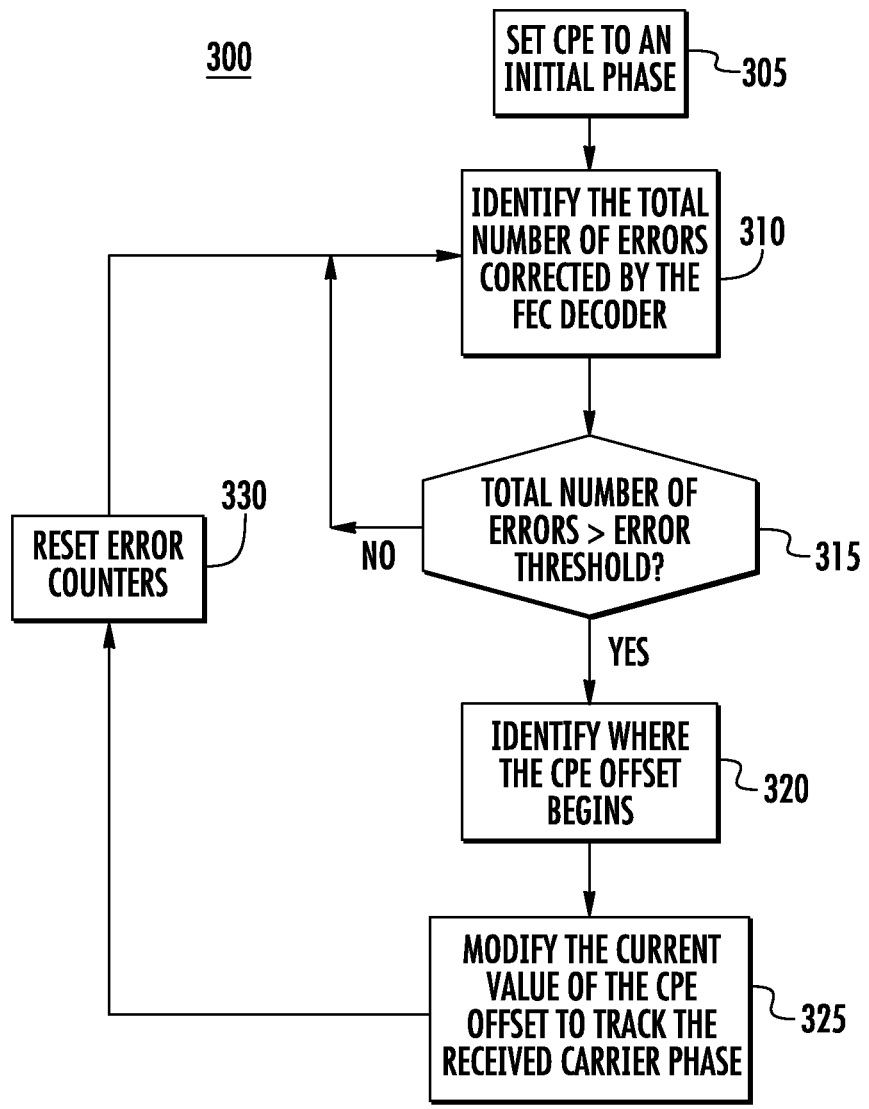
FIG. 3 is a flow diagram illustrating a process in accordance with the present disclosure.

FIG. 3 is a flow diagram of an exemplary CPE adjustment process 300 consistent with the present disclosure. The block flow diagram is illustrated with a particular sequence of steps. It can be appreciated, however, that the sequence of steps merely provides an example of how the general functionality described herein can be implemented. Further, each sequence of steps does not have to be executed in the order presented unless otherwise indicated.

The CPE offset may be set to an initial phase 305. The total number of errors corrected by the FEC decoder 126 may be identified at step 310 and accumulated by the decision CPE offset adjuster 128 until a predetermined error threshold is reached at step 315. Accumulating errors until the error threshold is exceeded avoids consecutive CPE offset adjustment corrections in a system wherein the number of errors reported in a particular sampling period is too low to be statistically important. As long as the total number of errors is not greater than a predetermined error threshold, the process may return to step 310 to continuously accumulate the errors until the total number of errors exceeds the predetermined error threshold.

The CPE offset update rate may thus be determined by the rate of errors. Systems operating at high thresholds may allow numerous sampling periods to pass before a total number of errors exceed the predetermined error threshold. However, in those systems operating at a low threshold, the error threshold may be exceeded in the first sampling period, (e.g., 1 second or first frame alignment word indicating an error).

Once the total number of errors exceeds the predetermined error threshold, the CPE offset adjustment value (e.g., 90° or −90°) and its starting location may be identified at step 320 by the FEC decoder 126. If the total number of errors is equal to, or within a predetermined acceptable value below the threshold, the error counters may be reset at step 330 and the process returns to step 310. If the total number of errors is not equal to, or not within a predetermined acceptable value below the threshold, the CPE offset may be modified at step 325 to correct the CPE offset. The error counters may then be reset 330 and flow may pass back to step 310.

At the point where the CPE offset error is detected, the direction (90° or −90°) of the CPE offset adjustment may be modified based on the polarity of the data. For example, in a system wherein data is modulated using a QPSK scheme, the polarity of the demodulated data, i.e., true or inverted, depends on the operating point of the QPSK demodulator. The direction of the CPE offset adjustment for the decision circuit 124 depends on the polarity of the data. To account for unknown demodulated data polarity, the FEC decoder 126 may continuously flip the received data polarity until it identifies and decodes a frame. The feedback from the FEC decoder 126 to the CPE offset adjuster 128 may then indicate the polarity of the data. The polarity of the data at the input to the decision circuit may determine the direction of the CPE offset adjustment (90° or −90°). In another embodiment, the demodulator may be configured to alternate between valid operating points until an FEC frame is detected.

Figure 4:
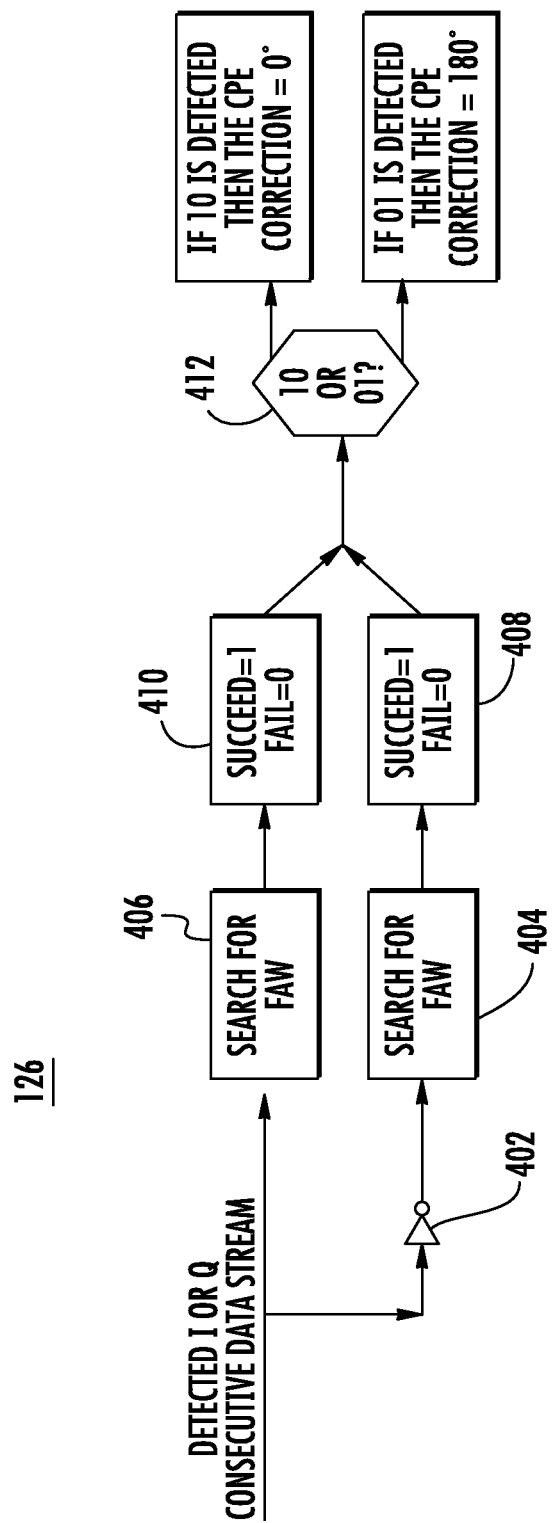
FIG. 4 is a logic diagram illustrating the correction of a CPE offset by utilizing known overhead bits in accordance with the present disclosure.

As illustrated in FIG. 4, a 180° offset may be checked and corrected by searching for valid preset overhead bits such as with a frame alignment word. In particular, FIG. 4 logically describes the correction of a 180° CPE offset by utilizing known overhead bits that are detected in the received data. Here the FEC decoder 126 detects the I or Q data streams. At element 402, consecutive bits are inverted then searched for frame alignment words at element 404. If element 404 succeeds in finding the frame alignment word a logical 1 is produced by element 408. If element 404 fails to find the frame alignment word a logical 0 is produced by element 408. At element 406 consecutive data bits are searched for frame alignment words. If element 406 succeeds in finding the frame alignment word a logical 1 is produced by element 410. If element 406 fails to find the frame alignment word a logical 0 is produced by element 410. At element 412 it is determined whether elements 410 and 408 produced a logic 10 or 01. If a logic 10 is produced, a CPE correction of 0° is needed for adjustment. If a logic 01 is produced, a CPE correction of 180° is needed for adjustment.

However, as shown in Table 1 above, when a 90° or −90° CPE offset occurs, the transmitted I and Q channel data will be detected in the Q and I channel of receiver 104, respectively. In this situation the CPE offsets can be detected by using different FEC codes or FEC structures within the I and Q channels.

Figure 5A:
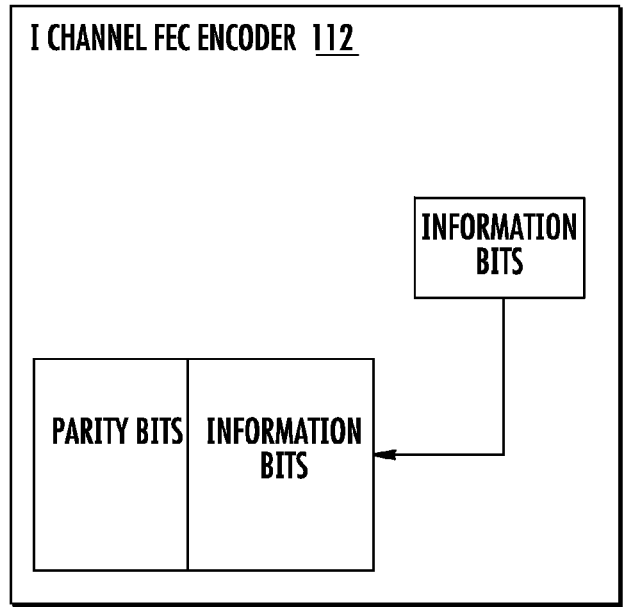
FIG. 5a logically illustrates a FEC encoder adding parity bits to information bits of an I channel in accordance with the present disclosure.
Figure 5B:
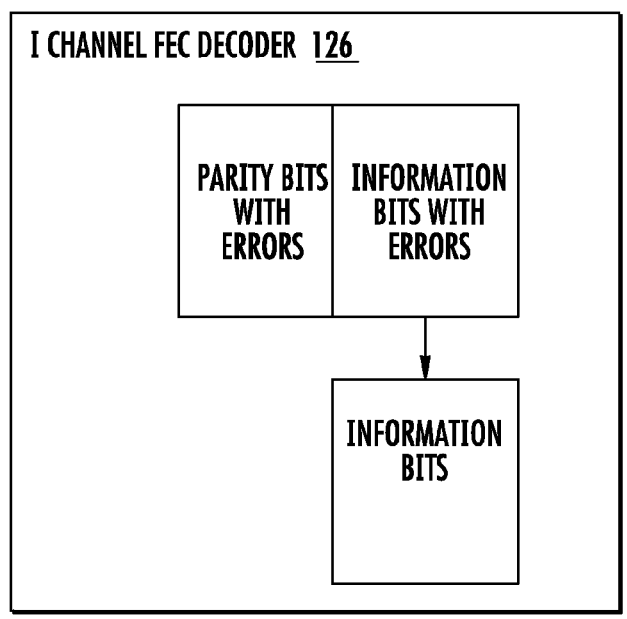
FIG. 5b logically illustrates the extraction of information bits of an I channel using an FEC decoder in accordance with the present disclosure.
Figure 6A:
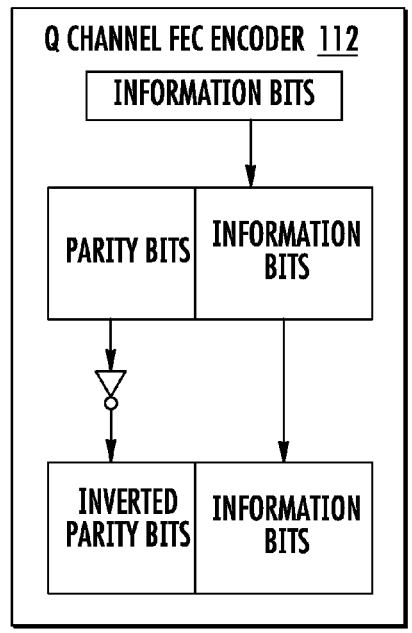
FIG. 6a logically illustrates a FEC encoder adding parity bits to information bits for a Q channel in accordance with the present disclosure.
Figure 6B:
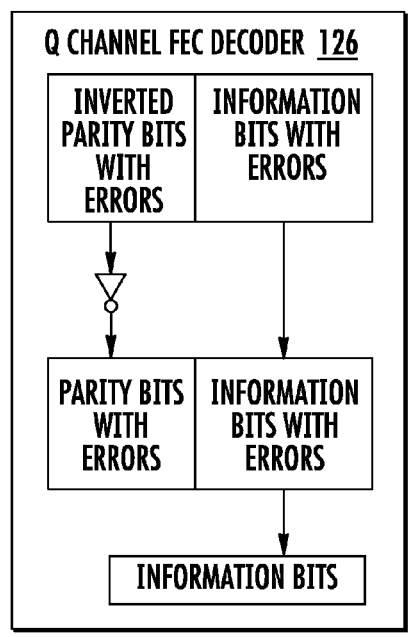
FIG. 6b logically illustrates the extraction of information bits of a Q channel using an FEC decoder in accordance with the present disclosure.

For example, one way to implement different FEC structures in the I and Q channels may be to invert all of the parity bits in one of the channels. FIG. 5a logically illustrates a FEC encoder 112 adding parity bits to information bits of an I channel. FIG. 5b logically illustrates the extraction of information bits using an FEC decoder 126. Here the information bits are extracted even though the parity bits and information bits may contain errors. As such, FIG. 6a logically illustrates a FEC encoder 112 adding parity bits to information bits for a Q channel. However, in this example the parity bits of the Q channel are inverted and attached to the information bits. FIG. 6b logically illustrates the extraction of information bits using an FEC decoder 126. Here the inverted parity bits with errors are inverted to parity bits with errors while the attached information bits are decoded with errors as well. Then the information bits may be extracted from the parity bits.

As explained above, to determine whether the CPE should be adjusted by 90° or −90°, the point at which the offset begins may first be identified. Staying with the exemplary I and Q FEC structures illustrated in FIGS. 5a-6b, wherein the I and Q channel data are swapped at the receiver 104 due to 90° or −90° CPE offset, both the I and Q channel FEC decoders will start to report decoding failures. This may determine where the offset begins. Additionally, when the total number of reported errors over one or more sampling periods exceeds a predetermined error threshold, the codeword or frame alignment word associated with that sampling period is identified. For example, Table 2, below, indicates where the phase tracking of the signal at receiver 104 was lost and where the CPE offset adjustment will start. In this example, Table 2 illustrates that CPE offset adjustment may be triggered when the number of reported errors exceeds 5 errors. With respect to the I channel codeword number 5 has 6 corrected errors. Thus, for this example, phase tracking for the I channel was lost at codeword 5 and CPE offset adjustment may be implemented at codeword 5. With respect to the Q channel, Table 2 indicates that codeword number 5 has 6 corrected errors. Thus, in this example, phase tracking for the Q channel was lost at codeword 5 and CPE offset adjustment may be implemented at codeword 5.

TABLE 2

| I CHANNEL | | Q CHANNEL | |
| --- | --- | --- | --- |
| CODEWORDS | NUMBER OF ERRORS CORRECTED | CODEWORDS | NUMBER OF ERRORS CORRECTED |
| 1 | 0 | 1 | 2 |
| 2 | 1 | 2 | 3 |
| 3 | 4 | 3 | 0 |
| 4 | 0 | 4 | 1 |
| 5 | 2 | 5 | 6 |
| 6 | 6 | 6 | 6 |
| 7 | 6 | 7 | 6 |
| 8 | 6 | 8 | 6 |
| 9 | 6 | 9 | 6 |

After identifying where the CPE lost the carrier phase (i.e., at what codeword), the CPE offset adjuster 128 may calculate the slope of the CPE 204 at the location where the CPE offset begins. If a steep negative slope is detected at the point where the offset began, a 90° offset adjustment may be applied to the decision circuit 124. If a steep positive slope is detected in the CPE 204 around the triggering frame alignment word or sampling period (where the phase was lost), a −90° correction may be applied. For example, the carrier phase estimate 204, as illustrated in FIG. 2a, may be offset by 90°. Thus, to match the carrier phase 202, the CPE may be adjusted with a 90° phase offset 206 by the CPE offset adjuster 128.

In this manner, there is provided a method and apparatus for FEC with CPE offset adjustment in an optical signal receiver. According to one aspect, there is provided an apparatus including a decision circuit for receiving an input signal and providing an output signal representing logic ones and zeros in response to comparison of said input signal with a CPE of said input signal; a FEC decoder configured to decode said output signal and to provide feedback representative of the number of errors corrected by said FEC decoder and indicating a polarity of said input signal; and a CPE offset adjuster configured to adjust said CPE in response to said feedback to reduce a number of said ones and zeros corrected by said FEC decoder.

According to another aspect of the invention, there is provided an optical communications system including an optical signal transmitter comprising an encoder for encoding a binary data stream and a modulator for modulating said encoded binary data stream to produce an encoded optical signal; an optical signal receiver for receiving said encoded optical signal, said optical signal receiver comprising: a demodulator for demodulating said encoded optical signal to provide an input signal; a decision circuit for receiving said input signal and providing an output signal representing logic ones and zeros in response to comparison of said input signal with a CPE of said input signal; a FEC decoder configured to decode said output signal and to provide feedback representative of a number of errors corrected by said FEC decoder and indicating a polarity of said input signal; and a CPE offset adjuster configured to adjust said CPE in response to said feedback to reduce the number of said ones and zeros corrected by said FEC decoder.

According to another aspect of the invention, there is provided a method of receiving an input signal and providing an output signal representing logic ones and zeros in response to comparing said input signal with a CPE of said input signal; decoding said output signal and providing a feedback representative of a number of errors corrected by a FEC decoder and indicating a polarity of said input signal; and adjusting said CPE in response to said feedback to reduce the number of said ones and zeros corrected by said FEC decoder.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A receiver utilized in an optical communication system comprising:
    a decision circuit for receiving an input signal and providing an output signal representing logic ones and zeros in response to a comparison of said input signal with a Carrier Phase Estimation (CPE) of said input signal;
    a forward error correction (FEC) decoder configured to decode said output signal and to provide feedback representative of the number of errors corrected by said FEC decoder and indicating a polarity of said input signal; and a CPE offset adjuster configured to adjust said CPE in response to said feedback to reduce a number of said ones and zeros corrected by said FEC decoder.

2. The apparatus according to claim 1, wherein said CPE offset adjuster is configured to adjust said CPE by an offset in a direction determined by the polarity of said input signal.

3. The apparatus according to claim 1, wherein said CPE offset adjuster is configured to adjust said CPE by an offset in a direction determined by a slope of the CPE at a location where the CPE offset begins.

4. The apparatus according to claim 1, wherein said input signal is a modulated signal using a quadrature phase shift keying (QPSK) format.

5. The apparatus according to claim 1, wherein said CPE offset adjuster is configured to add said number errors corrected by said FEC decoder over one or more sampling periods to determine a total number of said errors corrected by said FEC decoder over said one or more sampling periods, and wherein said CPE offset adjuster is configured to adjust said CPE when said total number of said errors exceeds a predetermined error threshold.

6. The apparatus according to claim 1, wherein said CPE offset adjuster is configured to add said number errors corrected by said FEC decoder over one or more frame alignment words to determine a total number of said errors corrected by said FEC decoder over said one or more frame alignment words, and wherein said CPE offset adjuster is configured to adjust said CPE when said total number of said errors exceeds a predetermined error threshold.

7. An optical communication system comprising:
an optical signal transmitter comprising an encoder for encoding a binary data stream and a modulator for modulating said encoded binary data stream to produce an encoded optical signal; and
an optical signal receiver for receiving said encoded optical signal, said optical signal receiver comprising:
a demodulator for demodulating said encoded optical signal to provide an input signal;
a decision circuit for receiving said input signal and providing an output signal representing logic ones and zeros in response to comparison of said input signal with a Carrier Phase Estimation (CPE) of said input signal;
a Forward Error Correction (FEC) decoder configured to decode said output signal and to provide feedback representative of a number of errors corrected by said FEC decoder and indicating a polarity of said input signal; and
a CPE offset adjuster configured to adjust said CPE in response to said feedback to reduce the number of said ones and zeros corrected by said FEC decoder.

8. The system according to claim 7, wherein said CPE offset adjuster is configured to adjust said CPE by an offset in a direction determined by the polarity of said input signal.

9. The system according to claim 7, wherein said CPE offset adjuster is configured to adjust said CPE by an offset in a direction determined by a slope of the CPE at a location where the CPE offset begins.

10. The system according to claim 7, wherein said input signal is a modulated signal using a Quadrature Phase Shift Keying (QPSK) format.

11. The system according to claim 7, wherein said CPE offset adjuster is configured to add said number errors corrected by said FEC decoder over one or more sampling periods to determine a total number of said errors corrected by said FEC decoder over said one or more sampling periods, and wherein said CPE offset adjuster is configured to adjust said CPE when said total number of said errors exceeds a predetermined error threshold.

12. The system according to claim 7, wherein said CPE offset adjuster is configured to add said number errors corrected by said FEC decoder over one or more frame alignment words to determine a total number of said errors corrected by said FEC decoder over said one or more frame alignment words, and wherein said CPE offset adjuster is configured to adjust said CPE when said total number of said errors exceeds a predetermined error threshold.

13. A method for processing a received optical communication signal, comprising:
receiving an input signal and providing an output signal representing logic ones and zeros in response to comparing said input signal with a Carrier Phase Estimation (CPE) of said input signal;
decoding said output signal and providing a feedback representative of a number of errors corrected by a Forward error Correction (FEC) decoder and indicating a polarity of said input signal; and
adjusting said CPE in response to said feedback to reduce the number of said ones and zeros corrected by said FEC decoder.

14. The method of claim 13 further comprising, adjusting said CPE by an offset in a direction determined by the polarity of said input signal.

15. The method of claim 13 further comprising, adjusting said CPE by an offset in a direction determined by a slope of the CPE at a location where the CPE offset begins.

16. The method of claim 13 further comprising, modulating the input signal using a QPSK format.

17. The method of claim 13 wherein providing a feedback representative of a number of errors corrected by a FEC decoder, further comprising adding said number errors corrected by said FEC decoder over one or more sampling periods to determine a total number of said errors corrected by said FEC decoder over said one or more sampling periods, and wherein said CPE offset adjuster is configured to adjust said CPE when said total number of said errors exceeds a predetermined error threshold.

18. The method of claim 13 wherein providing a feedback representative of a number of errors corrected by a FEC decoder, further comprising adding said number errors corrected by said FEC decoder over one or more frame alignment words to determine a total number of said errors corrected by said FEC decoder over said one or more frame alignment words, and wherein said CPE offset adjuster is configured to adjust said CPE when said total number of said errors exceeds a predetermined error threshold.

* * * * *